(12) United States Patent
Varadarajan et al.

(10) Patent No.: US 8,051,347 B2
(45) Date of Patent: Nov. 1, 2011

(54) SCAN-ENABLED METHOD AND SYSTEM FOR TESTING A SYSTEM-ON-CHIP

(75) Inventors: Devanathan Varadarajan, Bangalore (IN); Bindu Dibbur Narasingarao, Bangalore (IN); Viraj Narendra Patil, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 166 days.

(21) Appl. No.: 12/504,013

(22) Filed: Jul. 16, 2009

(65) Prior Publication Data
US 2011/0016364 A1    Jan. 20, 2011

(51) Int. Cl.
*G01R 31/28*  (2006.01)
*G11B 20/20*  (2006.01)
(52) U.S. Cl. ....................... 714/726; 714/700
(58) Field of Classification Search .......... 714/700, 714/724, 726, 727, 729
See application file for complete search history.

(56) References Cited

U.S. PATENT DOCUMENTS

| | | | |
|---|---|---|---|
| 5,490,268 A * | 2/1996 | Matsunaga ............... | 713/401 |
| 6,397,362 B1 * | 5/2002 | Ishiyama ................. | 714/724 |
| 6,615,392 B1 | 9/2003 | Nadeau-Dostie et al. | |
| 6,728,914 B2 * | 4/2004 | McCauley et al. .......... | 714/726 |
| 6,874,108 B1 * | 3/2005 | Abramovici et al. ......... | 714/725 |
| 7,065,683 B1 * | 6/2006 | Sluiter et al. .................. | 714/700 |
| 7,290,183 B2 * | 10/2007 | Shimamura ................... | 714/700 |
| 7,765,446 B2 * | 7/2010 | Nobekawa ..................... | 714/726 |
| 7,900,163 B2 * | 3/2011 | Weiner et al. ................. | 714/724 |

* cited by examiner

*Primary Examiner* — James C Kerveros
(74) *Attorney, Agent, or Firm* — Dawn V. Stephens; W. James Brady; Frederick J. Telecky, Jr.

(57) ABSTRACT

Scan-enabled method and system for testing a system-on-chip (SoC). The method includes electronically determining a slack in a signal at each port of a core of the SoC. The SoC includes multiple cores. Each core includes input ports and output ports. The method also includes selecting flip-flops for each port if the slack does not exceed a slack threshold. Further, the method includes integrating a wrapper cell to each port for which the slack exceeds the slack threshold. Moreover, the method includes coupling integrated wrapper cells and selected flip-flops corresponding to the input ports to form at least one input scan chain for the core, and corresponding to the output ports to form at least one output scan chain for the core. The method also includes testing the SoC using the at least one input scan chain and the at least one output scan chain of each core.

19 Claims, 4 Drawing Sheets

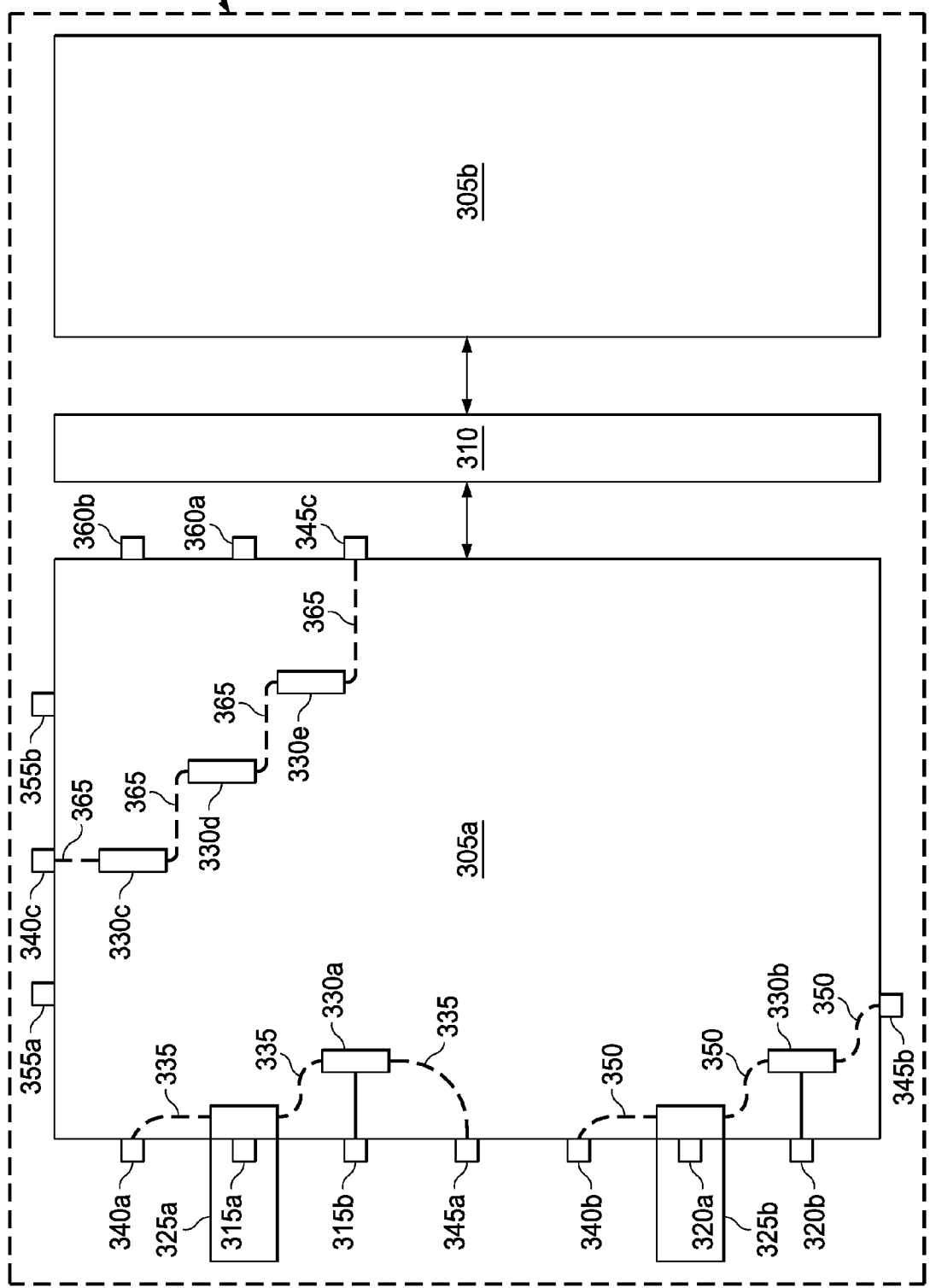

SCAN-ENABLED METHOD AND SYSTEM FOR TESTING A SYSTEM-ON-CHIP

FIELD

Embodiments of the disclosure relate to scan-enabled method and system for testing a system-on-chip (SoC).

BACKGROUND

Various testing techniques are used to test multiple cores of a system-on-chip (SoC) and to test interfaces between the cores. It is desired to reduce test time of the SoC with minimal effect on functional timing of the SoC. Currently used test techniques make use of scan chains, for example a natural bounding chain and a wrapper scan chain, for isolating the cores of the SoC and enabling testing. However, the wrapper scan chain increases area of the integrated circuit by adding a flip-flop and a multiplexer along a functional path, and also impacts the functional timing. The natural bounding chain is formed by stitching core flip-flops that meet certain criteria. If the core is poorly registered, then the number of flip-flops forming the natural bounding chain is high and hence the test time is also high.

In light of the foregoing discussion there is a need for an efficient method and system for testing the SoC that overcomes one or more of the above-mentioned issues.

SUMMARY

Embodiments of the disclosure relate to scan-enabled method and system for testing a system-on-chip (SoC).

An example of a method includes electronically determining a slack in a signal at each port of a core of a system-on-chip (SoC). The SoC includes multiple cores. Each core includes input ports and output ports. The method also includes selecting flip-flops for each port if the slack does not exceed a slack threshold. Further, the method includes integrating a wrapper cell to each port for which the slack exceeds the slack threshold. Moreover, the method includes coupling integrated wrapper cells and selected flip-flops corresponding to the input ports to form at least one input scan chain for the core, and corresponding to the output ports to form at least one output scan chain for the core. The method also includes testing the SoC using the at least one input scan chain and the at least one output scan chain of each core.

An example of an article of manufacture includes a machine-readable medium. The machine-readable medium carries instructions operable to cause a programmable processor to perform electronically determining a slack in a signal at each port of a core of a system-on-chip (SoC). The SoC includes multiple cores. Each core includes input ports and output ports. Further, the machine-readable medium carries instructions operable to cause the programmable processor to perform selecting flip-flops for each port if the slack does not exceed a slack threshold and integrating a wrapper cell to each port if the slack exceeds the slack threshold. The machine-readable medium also carries instructions operable to cause the programmable processor to perform coupling integrated wrapper cells and selected flip-flops corresponding to the input ports to form at least one input scan chain for the core, and corresponding to the output ports to form at least one output scan chain for the core, thereby enabling testing of the SoC using the at least one input scan chain and the at least one output scan chain of each core.

An example of a system includes a communication interface in electronic communication with a system-on-chip (SoC). The SoC includes multiple cores. Each core includes input ports and output ports. The system also includes a memory that stores instructions and at least one threshold. Further, the system includes a processor responsive to the instructions to determine a slack in a signal at each port of a core of the SoC, to integrate a wrapper cell to each port for which the slack exceeds the slack threshold, to select flip-flops of the ports for which the slack does not exceed the slack threshold, and to couple integrated wrapper cells and selected flip-flops corresponding to the input ports to form at least one input scan chain, and corresponding to the output ports to form at least one output scan chain for the core.

An example of a system-on-chip (SoC) includes a plurality of cores. Each core includes input ports and output ports. The SoC also includes at least one input scan chain including a first wrapper cell for at least one input port and a first set of flip-flops for at least one other input port. The SoC further includes at least one output scan chain including a second wrapper cell for at least one output port and a second set of flip-flops for at least one other output port. Moreover, the SoC includes at least one internal scan chain including all flip-flops other than those included in the at least one input scan chain and the at least one output scan chain. The SoC also includes an interface coupling the plurality of cores.

BRIEF DESCRIPTION OF THE VIEWS OF DRAWINGS

FIG. 3 is a schematic representation of a system-on-chip in accordance with one embodiment.

DETAILED DESCRIPTION OF THE EMBODIMENTS

Figure 1A:
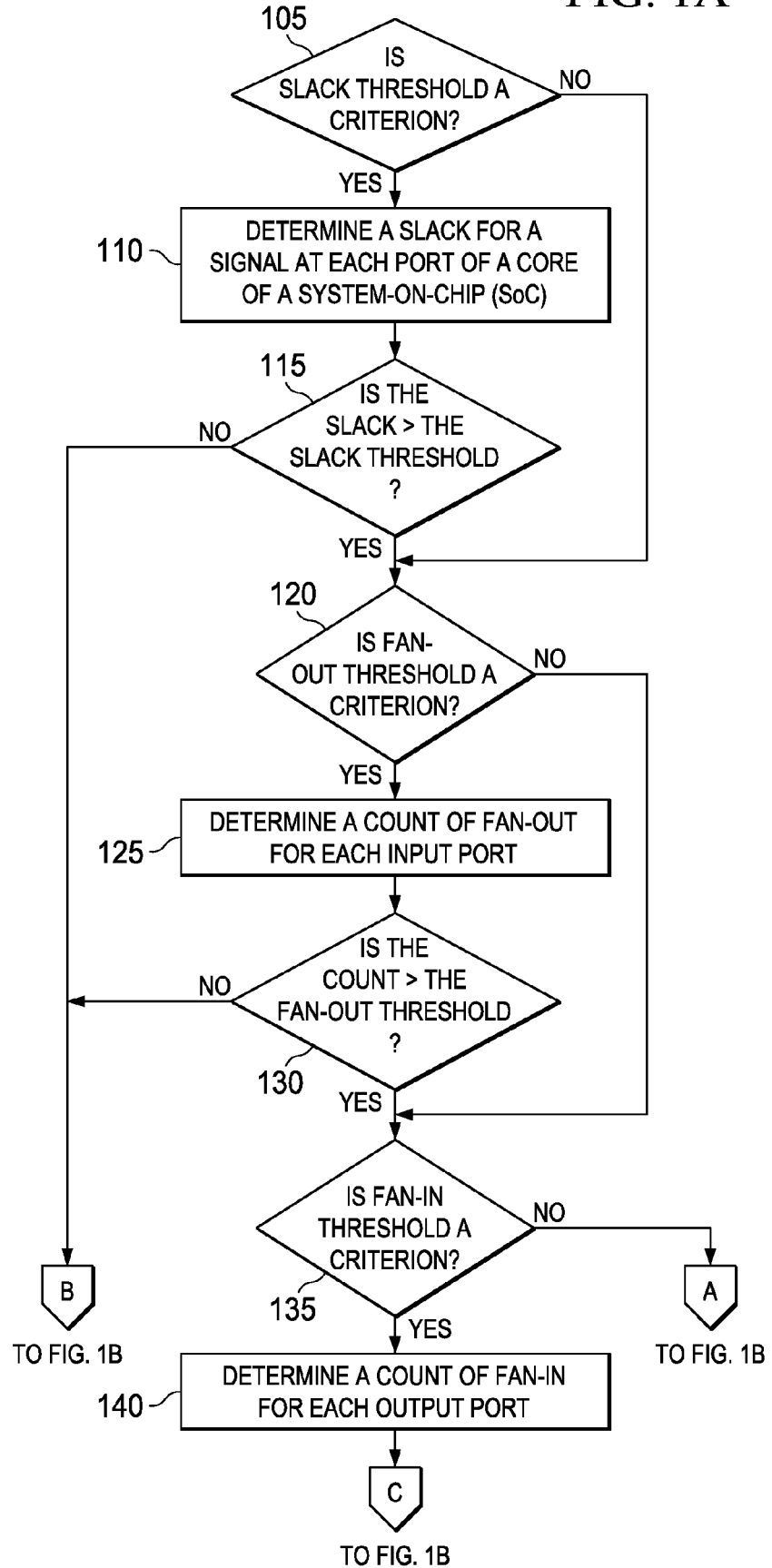
FIG. 1 is a flow diagram illustrating a method for testing a system-on-chip in accordance with one embodiment.
Figure 1B:
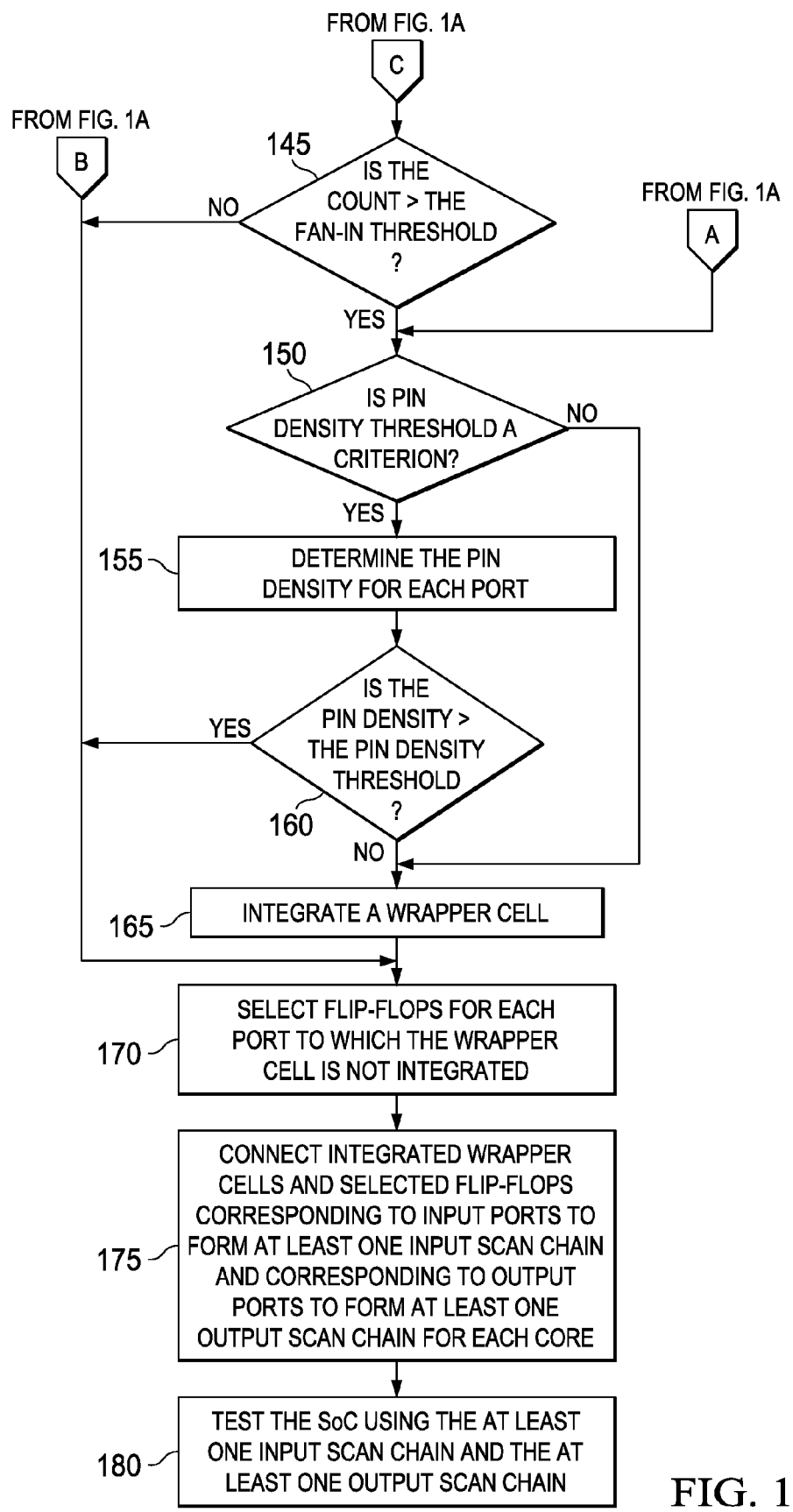

FIG. 1 is a flow diagram illustrating a method for testing a system-on-chip (SoC). The SoC can be an application specific integrated circuit (ASIC) based chip. The SoC includes multiple cores. The SoC also includes interfaces, for example combinational logic circuits, that enable communication among the cores. The cores may be defined as functional blocks embedded in the SoC. Examples of the functional blocks include, but are not limited to, microprocessors, memory arrays, and digital signal processors. Each core can include multiple input ports and multiple output ports. The input ports and the output ports can be present at periphery of each core.

At step 105, a check is performed to determine whether a slack threshold is a criterion. If the slack threshold is determined as the criterion then step 110 is performed, else step 120 is performed.

At step 110, a slack is determined for a signal at each port of a core of the SoC. Signals can be different for different ports. The slack can be determined by subtracting expected arrival time of the signal at an end point from a time budget. The signal traverses from a start point to the end point. The time budget can be defined as time allotted for the signal to traverse a critical path. The critical path is the path for which time required by the signal to traverse from a start point to an end point is highest. In one embodiment, the slack is a positive value. For example, in the SoC a signal can traverse a first path (interface 1 to input port 1 to flip-flop 1) or a second path (interface 1 to input port 1 to flip-flop 2). The time required to travel from interface 1 to port 1 is 2 milliseconds (ms), from input port 1 to flip-flop 1 is 3 ms, and from input port 1 to flip-flop 2 is 1 ms. The first path is the critical path as the time required (2+3=5 ms) by the signal to traverse the first path is higher than the time required (2+1=3 ms) by the signal to traverse the second path. The time budget is 5 ms. If the signal arrives at the input port 1 after lapse of 1.85 ms then the expected arrival time at the end point (flip-flop 1) is 4.85 ms (1.85+3). The slack is 0.15 ms (5−4.85).

At step 115, the slack at each port of the core of the SoC is checked against the slack threshold. The slack threshold is a predefined value and can be different for different ports. The slack threshold can be fixed based on requirements of the SoC, and maximum functional timing variation that can be accommodated for a port. The slack threshold can also be determined based on operating frequency of the SoC. For example, the operating frequency of a memory chip can be different from the operating frequency of a digital signal processor (DSP). Hence, the slack threshold for the memory chip can be different from that of the DSP. The slack threshold can also be determined based on the operating frequency of the interfaces. Step 170 is performed for each port for which the slack does not exceed the slack threshold. Step 120 is performed for each port for which the slack exceeds the slack threshold. The checking of the slack threshold minimizes any effect on functional timing of the SoC and ensures that the functional timing of the SoC is met. The functional timing can be defined as the time in which the SoC is expected to yield an output in response to an input.

At step 120, a check is performed to determine whether a fan-out threshold is a criterion. The fan-out threshold is a predefined value and can be different for different ports. If the fan-out threshold is determined as the criterion then step 125 is performed, else step 135 is performed. The determination can be made based on requirements of a customer of the SoC.

At step 125, count of fan-out is determined for each input port, and is checked against the fan-out threshold at step 130. If the count exceeds the fan-out threshold then the criterion of the fan-out threshold is considered to be met and step 135 is performed, else step 170 is performed.

At step 135, a check is performed to determine whether a fan-in threshold is a criterion. The fan-in threshold is a predefined value and can be different for different ports. If the fan-in threshold is determined as the criterion then step 140 is performed, else step 150 is performed. The determination can be made based on requirements of the customer of the SoC.

At step 140, count of fan-in is determined for each output port, and is checked against the fan-in threshold at step 145. If the count exceeds the fan-in threshold then the criterion of the fan-in threshold is considered to be met and step 150 is performed, else step 170 is performed.

At step 150, a check is performed to determine whether a pin density threshold is a criterion. The pin density threshold is a predefined value and can be different for different ports. If the pin density threshold is determined as the criterion then step 155 is performed, else step 165 is performed. The determination can be made based on requirements of the customer of the SoC.

At step 155, the pin density is determined for each port and is checked against the pin density threshold at step 160. In one embodiment, the pin density for a port can be determined by selecting a square unit area surrounding the port and determining number of ports in the square unit area. If the pin density does not exceed the pin density threshold then the criterion of the pin density threshold is considered to be met and step 170 is performed, else step 165 is performed.

In some embodiments, each core can be divided into multiple areas of a predefined unit area. The pin density corresponding to each area can be checked against the pin density threshold. If the pin density of the area does not exceed the pin density threshold then for all the ports present in the area step 170 is performed, else step 165 is performed.

At step 165, a wrapper cell is integrated to each port for which the slack exceeds the slack threshold. In some embodiments, the wrapper cell is also integrated to the ports that meet at least one other criterion from the fan-in threshold, the fan-out threshold and the pin density threshold, and for which the slack exceeds the slack threshold.

In one embodiment, several instances of the same wrapper cell can be integrated. In another embodiment, different wrapper cells can be integrated for different ports. The wrapper cell is a circuit including a flip-flop and a multiplexer. The wrapper cell isolates each port of the core by capturing the signal at each port.

The wrapper cell can be integrated as the delay caused by addition of a flip-flop and a multiplexer can be accommodated, without affecting the functional timing, as the slack is high. A wrapper cell which is integrated can be referred to as an integrated wrapper cell.

At step 170, flip-flops are selected for each port to which the wrapper cell is not integrated. The flip-flops are present on the periphery and are coupled to either the input ports or to the output ports. For example, if an input port of a core fans out to drive three flip-flops and the slack of the signal at the input port does not exceed the slack threshold, then all three flip-flops driven by the input port are selected. A flip-flop which is selected can be referred to as a selected flip-flop.

In some embodiment, step 120 through step 155 can be bypassed and step 165 can be performed if the slack exceeds the slack threshold. One or more criteria from the fan-in threshold, the fan-out threshold and the pin density threshold can be checked in addition to the slack threshold criterion based on requirement of the customer of the SoC and requirement of the SoC.

In some embodiments, the wrapper cells are removed from the ports for which wrapper cells are already integrated and the slack does not exceed the slack threshold. The wrapper cells are also removed from the ports for which wrapper cells are already integrated, the slack exceeds the slack threshold, and at least one other criterion from the fan-in threshold, the fan-out threshold and the pin density threshold is not met.

At step 175, integrated wrapper cells and selected flip-flops corresponding to the input ports are coupled to form at least one input scan chain for the core, and integrated wrapper cells and selected flip-flops corresponding to the output ports are coupled to form at least one output scan chain for the core. Each scan chain includes a plurality of flip-flops present on periphery of the core, a scan input pin coupled to a first flip-flop in the scan chain, and a scan output pin coupled to a last flip-flop in the scan chain. In addition, each scan chain can also have one or more test pins and a scan enable pin. The input scan chains are separate from the output scan chains in order to increase controllability of the integrated wrapper cells and the selected flip-flops.

In some embodiments, the flip-flops of the core which are not included in either the input scan chains or in the output scan chains can be coupled to form at least one internal scan chain.

In some embodiments, during physical designing of the SoC, that happens either just before or after the integrated wrapper cells and the selected flip-flops are coupled, a check to determine whether a wire length threshold is a criterion can be performed. The wire length threshold is a predefined value. The determination can be made based on requirements of the customer of the SoC. If the wire length threshold is not determined to be the criterion then step 180 is performed, else wire length required for coupling two adjacent flip-flops of each scan chain is determined. The wire length is checked against the wire length threshold.

In some embodiments, depending on functional requirements of the SoC, the criteria can be prioritized. For example, the slack threshold criterion can have higher priority than the wire length threshold criterion.

In one aspect, if the adjacent flip-flops are of two adjacent wrapper cells and the wire length does not exceed the wire length threshold then the two wrapper cells are retained. The two adjacent wrapper cells correspond to two ports. In some embodiments, priority is given to the wire length threshold criterion over the slack threshold criterion based on requirement of the SoC. If the wire length exceeds the wire length threshold then any one wrapper cell from the two adjacent wrapper cells can be removed and flip-flops can be selected for the port for which the wrapper cell is removed. The wire length between the flip-flop of the wrapper cell and adjacent flip-flop of the port, for which the wrapper cell is removed, can then be checked against the wire length threshold. If the wire length does not exceed the wire length threshold after removing the wrapper cell from the port then, step 180 is performed. If the wire length still exceeds the wire length threshold then the wrapper cell of other port from the two ports can be removed, the wire length between the flip-flop of the wrapper cell and adjacent flip-flop of the other port, for which the wrapper cell is removed, can then be checked against the wire length threshold. If the wire length does not exceed the wire length threshold after removing the wrapper cell from the other port then, step 180 is performed. If the wire length still exceeds the wire length threshold then wrapper cells from both the ports can be removed and wire length between adjacent flip-flops of the two ports can be checked against the wire length threshold. If the wire length does not exceed the wire length threshold after removing the wrapper cells from the two ports then step 180 is performed, else the two wrapper cells are retained.

In another aspect, if the adjacent flip-flops are of a single port and the wire length between the adjacent flip-flops does not exceed the wire length threshold then the flip-flops are retained, else a wrapper cell can be inserted for the port based on preferences of the criteria.

In still another aspect, if the adjacent flip-flops are of a port having a wrapper cell and of another port not having a wrapper cell, and the wire length between the adjacent flip-flops does not exceed the wire length threshold then the wrapper cell for the port and flip-flop of the another port are retained, else either a wrapper cell can be inserted for the another port or the wrapper cell can be removed from the port based on preferences of the criteria.

At step 180, the SoC is tested using the at least one input scan chain and the at least one output scan chain of each core. The scan chains can be controlled using scan-enable signals. The scan-enable signals are provided separately to input scan chains and output scan chains. The scan-enable signals include an input scan-enable signal and an output scan-enable signal. In addition, various test signals are also provided. The test signals include INTEST and EXTEST signals. The INTEST signals are for testing the cores and the EXTEST signals are used for testing the interfaces.

During a function mode the scan-enable signals activate the core and initialize the flip-flops, and in a scan mode the scan-enable signals activate the testing. In INTEST mode when the input scan-enable signal activates the testing of ports of an input scan chain, data is launched into the scan input pin of the input scan chain. The input scan-enable signal is maintained at logic HI level. The data is shifted through the input scan chain and is read at the scan output pin of the input scan chain. If the data is not produced or is different than what is expected at the scan output pin then a fault is detected across the scan chain. In EXTEST mode when the output scan-enable signals activate the testing of an interface coupled to the output ports of an output scan chain, data is launched into the scan output pin of the output scan chain. The output scan-enable signal is maintained at logic HI level. The data is shifted through the output scan chain and is read at the scan output pin of the output scan chain. If the data is not produced or is different than what is expected at the scan output pin then a fault is detected in the interface.

Various other testing techniques can also be used. For example, the testing technique described in U.S. Pat. No. 6,615,392 assigned to Logicvision, Inc., which is incorporated herein by reference in its entirety, can be used.

It is noted that one or more parameters used for determining the slack threshold can be used for determining other thresholds, for example the pin density threshold, the fan-in threshold and the fan-out threshold.

Figure 2:
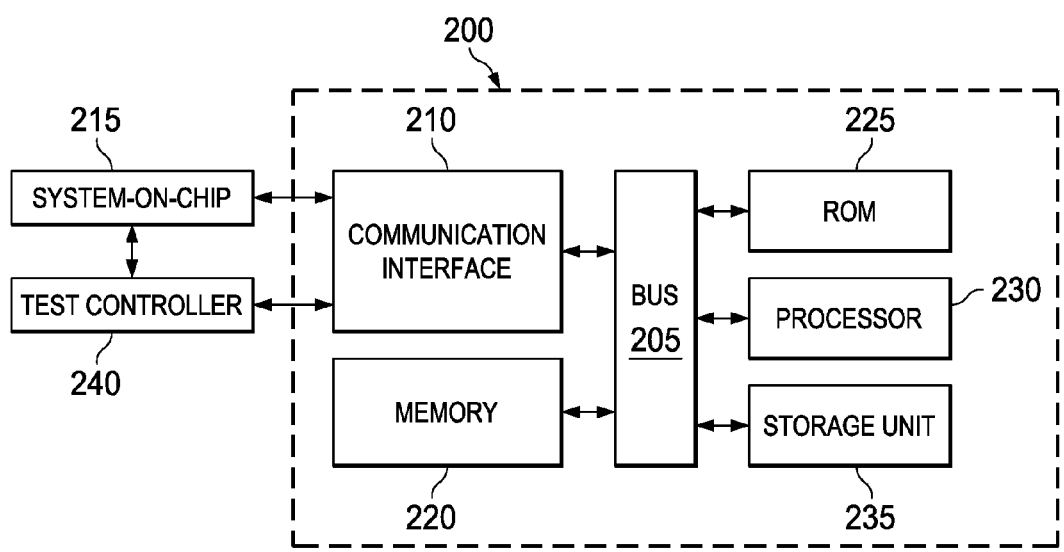
FIG. 2 illustrates a block diagram of a system in accordance with one embodiment.

FIG. 2 illustrates a block diagram of a system 200. Examples of the system 200 include, but are not limited to, a computer system, a microprocessor and a data processing unit. The system 200 includes a bus 205 for communicating information among various elements of the system 200. A communication interface 210, coupled to a system-on-chip (SoC) 215, enables communication between the SoC 215 and the system 200. The communication interface 210 can include one or more ports. Examples of the one or more ports include, but are not limited to, an IEEE 802.11, and a Universal Serial Bus (USB) port.

The SoC 215 includes multiple cores. Each core includes input ports and output ports. The cores of the SoC 215 can be tested by the system 200 or by a test controller 240, for example a microprocessor, in conjunction with the system 200.

The system 200 includes a memory 220 that stores instructions and at least one threshold. Examples of thresholds include, but are not limited to, a slack threshold, a pin density threshold, a fan-in threshold, a fan-out threshold, and a wire length threshold. The memory 220 can be a random access memory (RAM) coupled to the bus 205 for storing instructions, or any other temporary information required by a processor 230. The system 200 further includes a read only memory (ROM) 225 coupled to the bus 205 for storing static information and instructions for the processor 230. A system storage unit 235, for example a magnetic disk, hard disk or optical disk, can be provided and coupled to the bus 205 for storing information and instructions.

In one embodiment, the steps of the disclosure are performed by the system 200 in response to the processor 230 executing instructions stored in the memory 220. The instructions can be read into the memory 220 from a machine-readable medium, for example the system storage unit 235. In alternative embodiments, hard-wired circuitry can be used in place of or in combination with software instructions to implement various embodiments.

The term machine-readable medium can be defined as a medium providing data to a machine to enable the machine to perform a specific function. The machine-readable medium can be a storage media. Storage media can include non-volatile media and volatile media. The system storage unit 235 can be a non-volatile media. The memory 220 can be a volatile media. All such media must be tangible to enable the instructions carried by the media to be detected by a physical mechanism that reads the instructions into the machine.

Examples of the machine readable medium includes, but are not limited to, a floppy disk, a flexible disk, hard disk, magnetic tape, a CD-ROM, optical disk, punchcards, paper-tape, a RAM, a PROM, EPROM, and a FLASH-EPROM. The machine readable medium can also include online links, download links, and installation links providing the instructions to be executed by the processor 230.

In some embodiments, the processor 230 is responsive to the instructions to develop scan chains for the SoC 215 and to test the SoC 215 using the scan chains. The processor 230 determines ports of the core meeting at least one threshold.

Further, the processor 230 selects flip-flops for the ports which do not meet at least one criterion. The processor 230 also couples the integrated wrapper cells and the flip-flops to form at least one scan chain. The scan chains include at least one input scan chain and at least one output scan chain.

The test controller 240 provides scan-enable signals to the at least one input chain and to the at least one output scan chain separately to enable testing of the SoC 215.

In some embodiments, the processor 230 can include one or more processing units for performing one or more functions of the processor 230. The processing units are hardware circuitry performing specified functions.

In some embodiments, the processor can perform the functions of the test controller 240.

FIG. 3 is a schematic representation of an SoC 300. The SoC 300 can include a test circuit developed based on the method described in FIG. 1.

The SoC 300 includes multiple cores coupled to each other through an interface, for example a core 305a and a core 305b are coupled to each other through an interface 310. The core 305a includes multiple input ports, for example an input port 315a and an input port 315b and multiple output ports, for example an output port 320a and an output port 320b. The input port 315a is integrated with a wrapper cell 325a and the input port 315b is coupled to a flip-flop 330a.

The SoC 300 also includes at least one input scan chain, for example an input scan chain 335. The input scan chain 335 includes the wrapper cell 325a (a first wrapper cell) and the flip-flop 330a (a first set of flip-flops). In some embodiments, the set can also include one flip-flop. One end of the input scan chain 335 is coupled to a scan input pin 340a and other end is coupled to a scan output pin 345a.

The SoC 300 further includes at least one output scan chain, for example an output scan chain 350. The output scan chain 350 includes a wrapper cell 325b (a second wrapper cell) and a flip-flop 330b (a second set of flip-flops). The wrapper cell 325b corresponds to the output port 320a and the flip-flop 330b corresponds to the output port 320b. One end of the output scan chain 350 is coupled to a scan input pin 340b and other end is coupled to a scan output pin 345b.

The SoC 300 also include test pins, for example an INTEST test pin 355a and an EXTEST test pin 355b are also present through which test signals are received. In some embodiments, the test pins can be common for the INTEST and the EXTEST. A scan-enable pin 360a and a scan-enable pin 360b are also present to receive the scan-enable signals and enable testing. The scan-enable pin 360a can control the at least one input scan chain and the scan-enable pin 360b can control the at least one output scan chain.

Moreover, the SoC 300 includes at least one internal scan chain, for example an internal scan chain 365. The internal scan chain 365 includes all flip-flops, for example a flip-flop 330c, a flip-flop 330d and a flip-flop 330e, other than those included in the at least one input scan chain or the at least one output scan chain. One end of the internal scan chain 365 is coupled to a scan input pin 340c and other end is coupled to a scan output pin 345c.

The SoC 300 also includes one or more interfaces, for example an interface 370 coupling the core 305a and the core 305b.

Other cores of the SoC 300 also include input scan chains, output scan chains and internal scan chains.

It is appreciated that the SoC includes more circuit components, for example power supply, than that shown in FIG. 3.

Various embodiments include adding a wrapper cell to a port based on a slack threshold criterion and minimizes effect on functional timing of an SoC.

In the foregoing discussion, the term "coupled" refers to either a direct electrical connection between the devices connected or an indirect connection through intermediary devices. The term "circuit" means at least either a single component or a multiplicity of components, that are connected together to provide a desired function. The term "signal" means at least one current, voltage, charge, data, or other signal.

Those skilled in the art will recognize that a wide variety of modifications, alterations, and combinations can be made with respect to the above described embodiments without departing from the scope of the disclosure, and that such modifications, alterations, and combinations are to be viewed as being within the ambit of the disclosure.

What is claimed is:

1. A method comprising:
    electronically determining a slack in a signal at each port of a core of a system-on-chip (SoC), the SoC comprising multiple cores, each core comprising input ports and output ports;
    selecting flip-flops for each port for which the slack does not exceed a slack threshold;
    integrating a wrapper cell to each port for which the slack exceeds the slack threshold;
    coupling integrated wrapper cells and selected flip-flops corresponding to the input ports to form at least one input scan chain for the core, and corresponding to the output ports to form at least one output scan chain for the core; and
    testing the SoC using the at least one input scan chain and the at least one output scan chain of each core.

2. The method as claimed in claim 1 and further comprising an article of manufacture that includes a computer readable medium for storing a set of computer executable instructions which, when executed by a computer, causes the computer to to perform the method of claim 1.

3. The method as claimed in claim 1 and further comprising:
    coupling flip-flops other than the selected flip-flops to form at least one internal scan chain.

4. The method as claimed in claim 3 and further comprising an article of manufacture that includes a computer readable medium for storing a set of computer executable instructions which, when executed by a computer, causes the computer to to perform the method of claim 3.

5. The method as claimed in claim 1, wherein determining the slack comprises:
    determining a time budget corresponding to the signal; and
    determining difference between the time budget and expected arrival time of the signal at an end point of the signal.

6. The method as claimed in claim 5 and further comprising an article of manufacture that includes a computer readable medium for storing a set of computer executable instructions which, when executed by a computer, causes the computer to perform the method of claim 5.

7. The method as claimed in claim 1, wherein selecting flip-flops of a port comprises:
   removing the wrapper cell from the port if the core has the wrapper cell integrated to the port.

8. The method as claimed in claim 7 and further comprising an article of manufacture that includes a computer readable medium for storing a set of computer executable instructions which, when executed by a computer, causes the computer to comprising a set of computer executable instructions adapted to perform the method of claim 7.

9. The method as claimed in claim 1, wherein the integrating comprises:
   determining whether pin density threshold is a criterion;
   determining a pin density for each port if the pin density threshold is determined as the criterion; and
   integrating the wrapper cell to the port if the pin density does not exceed the pin density threshold.

10. The method as claimed in claim 9 and further comprising an article of manufacture that includes a computer readable medium for storing a set of computer executable instructions which, when executed by a computer, causes the computer to perform the method of claim 9.

11. The method as claimed in claim 1, wherein the integrating comprises:
   if a port is an input port
      determining whether fan-out threshold is a criterion,
      determining count of fan-out for the port if the fan-out threshold is determined as the criterion, and
      integrating the wrapper cell to the port if the count exceeds the fan-out threshold; and if the port is an output port
      determining whether fan-in threshold is a criterion,
      determining count of fan-in for the port if the fan-in threshold is determined as the criterion, and
      integrating the wrapper cell to the port if the count exceeds the fan-in threshold.

12. The method as claimed in claim 11 and further comprising an article of manufacture that includes a computer readable medium for storing a set of computer executable instructions which, when executed by a computer, causes the computer to perform the method of claim 11.

13. The method as claimed in claim 1 wherein the coupling comprises:
   determining whether wire length threshold is a criterion;
   determining a wire length for coupling two adjacent flip-flops in each scan chain if the wire length threshold is determined as the criterion;
   removing the wrapper cell from the port if the wire length exceeds the wire length threshold; and
   modifying scan chain corresponding to the port.

14. The method as claimed in claim 13 and further comprising an article of manufacture that includes a computer readable medium for storing a set of computer executable instructions which, when executed by a computer, causes the computer to perform the method of claim 13.

15. The method as claimed in claim 1, wherein the testing comprises:
   providing scan-enable signals to the at least one input scan chain and to the at least one output scan chain separately.

16. The method as claimed in claim 15 and further comprising an article of manufacture that includes a computer readable medium for storing a set of computer executable instructions which, when executed by a computer, causes the computer to perform the method of claim 15.

17. A system comprising:
   A communication interface in electronic communication with a system-on-chip (SoC), the SoC comprising multiple cores, each core comprising input ports and output ports;
   a memory that stores instructions and at least one threshold, the at least one threshold comprising a slack threshold; and
   a processor responsive to the instructions to
      determine a slack in a signal at each port of a core of the SoC,
      integrate a wrapper cell to each port for which the slack exceeds the slack threshold,
      select flip-flops of the ports for which the slack does not exceed the slack threshold, and
      couple integrated wrapper cells and selected flip-flops corresponding to the input ports to form at least one input scan chain, and corresponding to the output ports to form at least one output scan chain for the core.

18. The system as claimed in claim 17 and further comprising:
   a test controller, coupled to the communication interface, that provides scan-enable signals to the at least one input scan chain and to the at least one output scan chain separately for testing.

19. A system-on chip comprising:
   a plurality of cores, each core comprising:
      input ports,
      output ports,
      at least one input scan chain comprising a first wrapper cell for at least one input port and comprising a first set of flip-flops for at least one other input port,
      at least one output scan chain comprising a second wrapper cell for at least one output port and comprising a second set of flip-flops for at least one other output port, and
      at least one internal scan chain comprising all flip-flops other than those comprised in the at least one input scan chain and the at least one output scan chain; and
   an interface coupling the plurality of cores.

* * * * *